United States Patent
Brainard et al.

(10) Patent No.: US 6,352,203 B1
(45) Date of Patent: *Mar. 5, 2002

(54) AUTOMATED SEMICONDUCTOR IDENTIFICATION SYSTEM

(75) Inventors: Jim W. Brainard, Houston, TX (US); Eric M. Monsef, Los Gatos, CA (US)

(73) Assignee: Compaq Information Technologies Group, L.P., Houston, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,691

(22) Filed: Mar. 17, 1999

(51) Int. Cl.⁷ ................................................. G06K 7/08
(52) U.S. Cl. ........................ 235/451; 235/449; 235/375
(58) Field of Search ............................... 235/383, 381, 235/449, 472.01, 462.13, 375, 376, 435; 29/740, 714, 712, 832, 833

(56) References Cited

U.S. PATENT DOCUMENTS

| | | | | |
|---|---|---|---|---|
| 4,195,771 A | * | 4/1980 | Lagarde ........................ | 235/380 |
| 4,721,849 A | * | 1/1988 | Davis et al. .................. | 235/472 |
| 4,868,375 A | * | 9/1989 | Blanford ...................... | 235/462 |
| 5,129,974 A | * | 7/1992 | Aurenius ...................... | 156/64 |
| 5,331,507 A | * | 7/1994 | Kyung et al. ................. | 361/720 |
| 5,488,223 A | * | 1/1996 | Austin et al. ................ | 235/375 |
| 5,546,672 A | * | 8/1996 | Campbell et al. .............. | 33/716 |
| 5,627,354 A | * | 5/1997 | Schneider et al. ........... | 235/375 |
| 5,644,102 A | * | 7/1997 | Rostoker ...................... | 174/52.1 |
| 5,770,841 A | * | 7/1998 | Moed et al. .................. | 235/375 |
| 5,825,625 A | * | 10/1998 | Esterberg et al. ............ | 361/719 |
| 5,831,859 A | * | 11/1998 | Medeiros et al. ............ | 364/478.06 |
| 5,878,484 A | * | 3/1999 | Araya et al. .................. | 39/740 |
| 5,919,713 A | * | 7/1999 | Ishii et al. ................... | 437/227 |
| 5,933,096 A | * | 8/1999 | Tsuda ........................... | 340/928 |
| 5,960,535 A | * | 10/1999 | Rubens et al. ................ | 29/832 |
| 5,966,307 A | * | 10/1999 | Lin ............................... | 264/474.01 |
| 5,984,176 A | * | 11/1999 | Kou .............................. | 235/375 |
| 6,027,019 A | * | 11/1999 | Kou .............................. | 235/375 |
| 6,040,565 A | * | 3/2000 | Akerlind ....................... | 219/705 |
| 6,054,924 A | * | 4/2000 | Dames et al. ................. | 340/572.6 |

FOREIGN PATENT DOCUMENTS

| | | | |
|---|---|---|---|
| JP | 57-071151 | * | 5/1982 |
| JP | 03-020739 | * | 1/1991 |
| JP | 06-196575 | * | 7/1994 |
| JP | 2000-208384 | * | 7/2000 |

* cited by examiner

*Primary Examiner*—Michael G. Lee
*Assistant Examiner*—Diane I. Lee
(74) *Attorney, Agent, or Firm*—Conley, Rose & Tayon, P.C.

(57) ABSTRACT

An apparatus is used to identify the type of microprocessor assembly mounted on a printed circuit board. A heat sink is coupled to the microprocessor assembly, and a label is coupled to the heat sink. The label has one of a plurality of preselected patterns of optically reflective and non-reflective areas formed thereon, and at least one photodetector is positioned adjacent the microprocessor assembly on the printed circuit board for detecting the preselected pattern.

8 Claims, 3 Drawing Sheets

AUTOMATED SEMICONDUCTOR IDENTIFICATION SYSTEM

BACKGROUND OF THE INVENTION

1. Field of the Invention

This invention relates generally to a method and apparatus for automatically detecting the type of semiconductor device in a circuit, and, more particularly, to a system for automatically identifying the core speed of a microprocessor.

2. Description of the Related Art

In the semiconductor industry, the speed rating assigned to a semiconductor chip, such as a microprocessor, is determined by testing after the device is manufactured. That is, various microprocessors from the same batch may be rated to operate at different speeds, depending upon the outcome of the testing process. The various speed microprocessors are sorted and sold at different prices, but are otherwise packaged identically, and have the same pin configurations. Accordingly, all of the microprocessors, regardless of their speed, may be installed in the same physical connector on a printed circuit board, such as a motherboard.

To insure that the computer system operates the installed microprocessor at its maximum intended speed, it has been conventional to locate jumpers on the motherboard. The jumpers may be manually configured to identify the type of microprocessor installed on the motherboard. That is, the end user is provided with a map to identify how the jumpers should be interconnected to properly identify the microprocessor installed on the motherboard.

The manual jumper arrangement is problematic in that the individual installing the microprocessor may be unaware of the need to alter the jumper arrangement, and/or may simply forget to do so. Thus, the installed microprocessor may run at a much slower speed, or may not operate at all.

The present invention is directed to overcoming, or at least reducing the effects of, one or more of the problems set forth above.

SUMMARY OF THE INVENTION

In one aspect of the present invention, an apparatus is provided for identifying a device mounted on a substrate. The apparatus includes a label coupled to the device and a sensor positioned adjacent the device on the substrate. The label has one of a plurality of preselected patterns formed thereon, and the sensor is capable of detecting the preselected pattern.

BRIEF DESCRIPTION OF THE DRAWINGS

The invention may be understood by reference to the following description taken in conjunction with the accompanying drawings, in which like reference numerals identify like elements, and in which.

Figure 1:
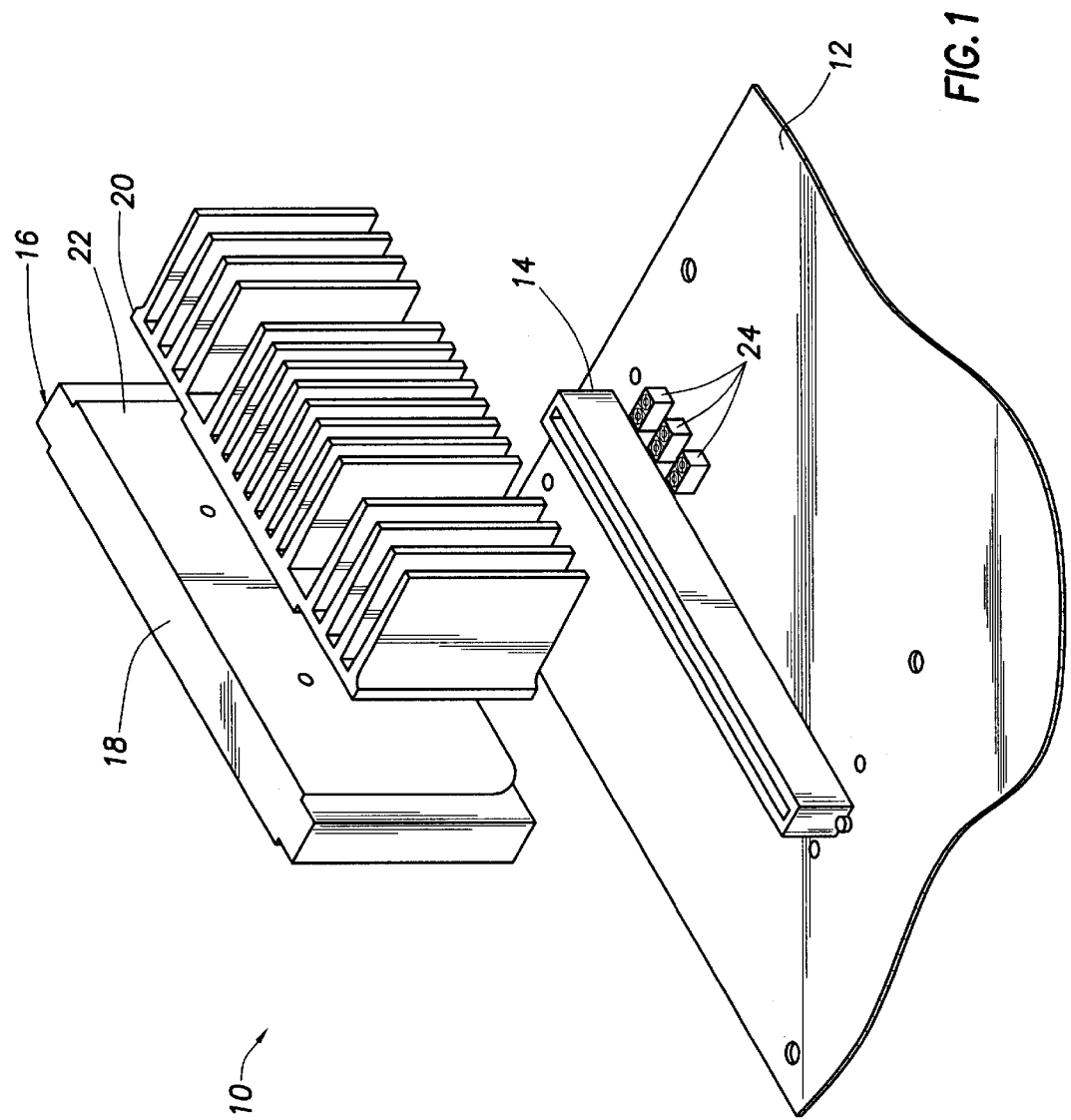
FIG. 1 is an exploded perspective view of one embodiment of the present invention.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in art having the benefit of this disclosure.

Referring now to the drawings, and in particular to FIG. 1, an exploded perspective view of a portion of a motherboard of a computer system 10 is shown. The motherboard 12 is shown with a conventional edge card connector 14 located on a surface thereof. The edge card connector 14 is of the type adapted to receive a microprocessor assembly 16, which in the illustrated embodiment is a slot 7 package available from Intel Corporation, such as is used with its Pentium II® microprocessor. The microprocessor assembly 16 includes an outer housing 18 with a microprocessor (not shown) mounted to a printed circuit board 19 (see FIG. 2) contained therein and adapted to be physically and electrically connected to the edge card connector 14. To facilitate the removal of heat from the microprocessor assembly 16, a heat sink 20 is coupled to a first side wall 22 of the housing 18 of the microprocessor assembly 16. The heat sink 20 may be coupled to the housing 18 by any of a variety of conventional methods, including but not limited to, gluing, soldering, riveting, bolting, or the like.

Accordingly, it should be appreciated that the heat sink 20 extends laterally from the housing 18 and overhangs the motherboard 12 adjacent the edge card connector 14. Positioned below the heat sink 20 is a plurality of photodetectors 24. Three photodetectors 24 are shown in the embodiment of FIG. 1; however, the number of photodetectors may be varied as needed to provide a sufficient number of unique combinations to identify all possible speeds of microprocessors that may be inserted into the edge card connector 14.

Figure 2:
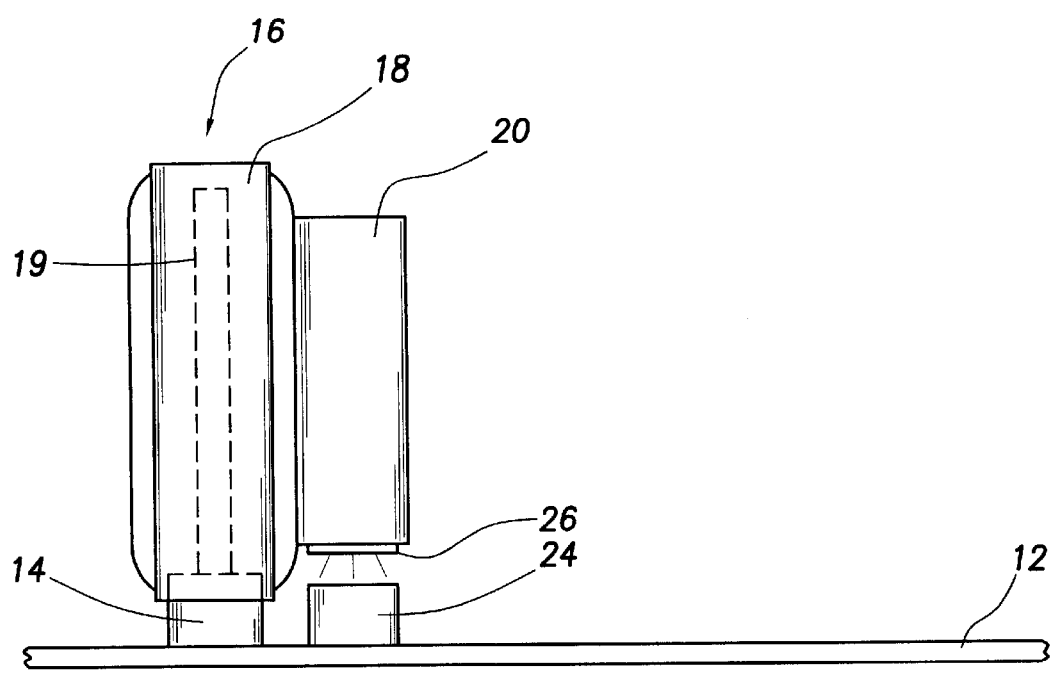
FIG. 2 is an assembled end view of the embodiment of FIG. 1.

A reflective/non-reflective strip is coupled to a lower surface of the heat sink 20 in an area generally overlying the photodetectors 24. FIG. 2 illustrates an end view of the assembled motherboard 12, better illustrating the location of the reflective strip 26 above and adjacent the photodetectors 24. Light generated by the photodetectors 24 is reflected/not reflected by the strip 26 in a pattern unique to the speed of the microprocessor installed in the edge card connector 14. Thus, this unique pattern on the strip 26 is detected to identify the speed at which the microprocessor may be operated.

Figure 5:
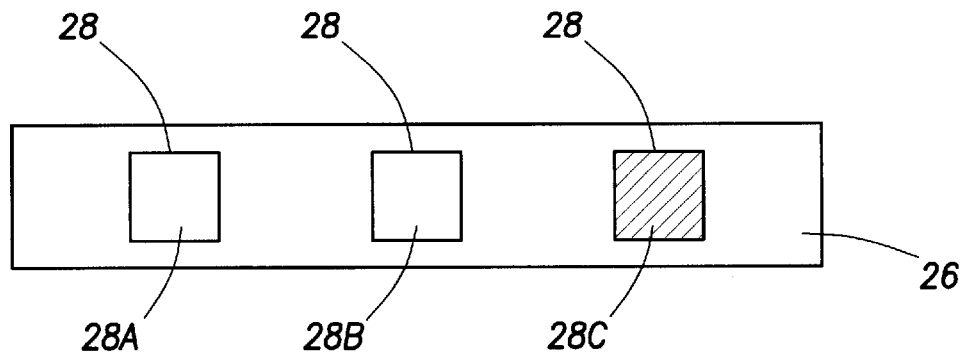
FIG. 5 depicts one embodiment of reflective markings on a heat sink of FIG. 1 used to identify the type of microprocessor attached thereto.

One example of a reflective strip 26 that may be attached to the heat sink 20 to identify the type of microprocessor included within the microprocessor assembly 16 is illustrated in FIG. 5. The reflective strip 26 includes three areas 28A, 28B, 28C that are positioned adjacent and readable by the three photodetectors 24. The areas 28A, 28B, 28C may be selectively coated to provide a surface that reflects a substantial portion of the light delivered to it, or absorbs a substantial portion of the light delivered to it. For example, the reflective strip 26 may take the form similar to that of a bar code present on many consumer goods. That is, the areas 28 may be coated to absorb light using a relatively dark ink, such as black, or may be made to reflect a substantial portion of the light by the absence of a dark ink in these areas. The three areas 28A, 28B, 28C may be selectively coated/not coated to provide eight unique codes, and thereby identify eight unique speeds of processor operation. For example, in the embodiment illustrated in FIG. 5, the areas 28A and 28B are not coated, while the area 28C is coated, producing the unique code 001. The number of areas 28 and the number of photodetectors 24 may be varied to accommodate a number of different operating speeds available for the microprocessor assembly 16 that may be installed in the edge card connector 14.

Figure 3:
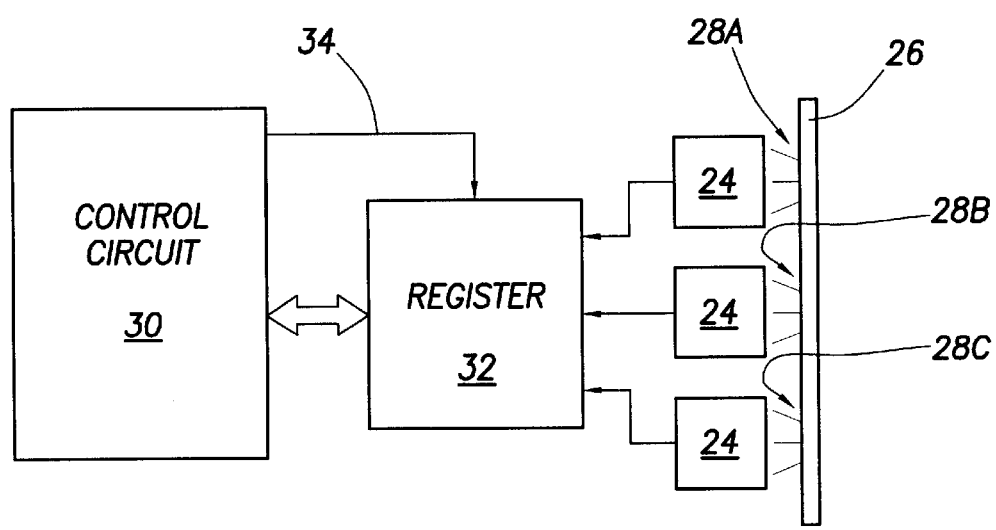
FIG. 3 illustrates a stylized block diagram of one embodiment of the present invention.

Referring now to FIG. 3, a stylized electrical schematic of one embodiment of the present invention is illustrated. A control circuit 30, which may be located on the motherboard 12, the printed circuit board 19, or within the microprocessor (not shown), controls the operation of a memory device 32, such as a register, to read the status of the photodetectors 24. That is, the photodetectors 24 read the pattern of the areas 28A, 28B, 28C from the reflective strip 26 and translate the presence/absence of the reflective areas 28 into logical signals (i.e., zero or one). The identification pattern read from the reflective strip 26 is converted to ones and zeros and stored in the register 32 under operation of the control circuit 30. Thereafter, the control circuit 30 reads the information contained in the ID register 32 and uses it to set the proper operating speed of the microprocessor assembly 16.

Figure 4:
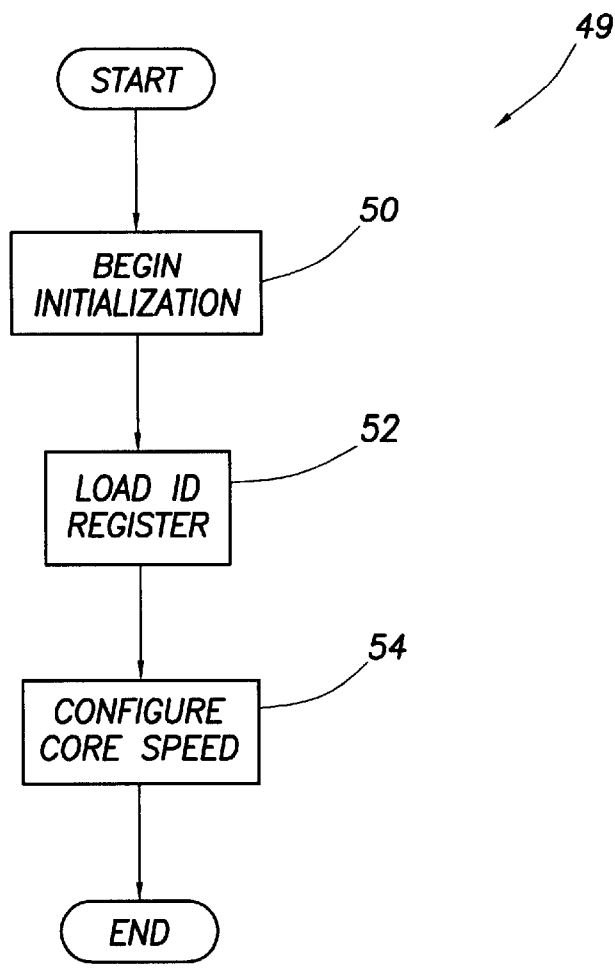
FIG. 4 illustrates a flowchart of one embodiment of software operating on the microprocessor of FIG. 1.

Referring now to FIG. 4, one embodiment of a control strategy implemented within the control circuit 30 is illustrated in a flowchart 49. It should be appreciated that the control strategy illustrated in the flowchart 49 may be implemented in software, hardware and/or firmware.

The control strategy starts at block 50 where the initialization process begins. In particular, at block 52, the ID register 32 is loaded in response to the delivery of a control signal over a line 34. That is, light reflected from the areas 28A, 28B, 28C is detected and loaded into the register 32 as a logical one. Similarly, light absorbed by the areas 28A, 28B, 28C is not detected by the photodetectors 24, and thus a logical zero is loaded into the register 32. The register 32 is thereafter read by the control circuit 30 over data lines 36. Finally, at block 54, the control circuit assists in configuring the core speed for the installed microprocessor (not shown) contained within the microprocessor assembly 16.

It should be appreciated that while the present invention has been disclosed with respect to a reflective strip 26 and photodetectors 24, it is envisioned that other sensor arrangements may be readily substituted without departing from the spirit and scope of the present invention. For example, it is envisioned that the photodetectors 24 could be replaced by magnetic sensors, such as hall effect sensors, and the reflective strip 26 could be replaced by an arrangement of magnetic/non-magnetic material.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus for identifying a semiconductor package mounted on a printed circuit board, comprising:

a heat sink coupled to said semiconductor package; a label coupled to said heat sink, said label having one of a plurality of preselected patterns formed thereon;

at least one sensor located on said printed circuit board and positioned adjacent said semiconductor package on said printed circuit board for detecting the preselected pattern; and a controller located on said printed circuit board for affecting operation of the semiconductor package responsive to the detected preselected pattern.

2. An apparatus, as set forth in claim 1, wherein said sensor includes a photodetector and said label includes one of a plurality of preselected patterns of optically reflective and non-reflective areas formed thereon.

3. An apparatus, as set forth in claim 1, including a memory storage device adapted to receive and store the detected pattern from said sensor.

4. An apparatus, as set forth in claim 1, wherein said sensor includes a magnetic sensor and said label includes one of a plurality of preselected patterns of magnetic and nonmagnetic areas formed thereon.

5. An apparatus, as set forth in claim 1, wherein the controller affects the operating speed of the semiconductor package responsive to the detected preselected pattern.

6. An apparatus for identifying a microprocessor assembly mounted on a printed circuit board, comprising:

a heat sink coupled to said microprocessor assembly;

a label coupled to said heat sink, said label having one of a plurality of preselected patterns of optically reflective and non-reflective areas formed thereon;

at least one photodetector located on said printed circuit board and positioned adjacent said microprocessor assembly on said printed circuit board for detecting the preselected pattern; and a controller located on said printed circuit board for affecting operation of the microprocessor assembly responsive to the detected preselected pattern.

7. An apparatus, as set forth in claim 6, including a memory storage device adapted to receive and store the detected pattern from said photodetector.

8. An apparatus, as set forth in claim 6, wherein the controller affects the operating speed of the microprocessor assembly responsive to the detected preselected pattern.

* * * * *